US011006516B2

(12) United States Patent
Imayoshi

(10) Patent No.: US 11,006,516 B2
(45) Date of Patent: May 11, 2021

(54) WIRING BOARD, SEMICONDUCTOR DEVICE, AND METHOD OF MANUFACTURING WIRING BOARD

(71) Applicant: TOPPAN PRINTING CO., LTD., Tokyo (JP)

(72) Inventor: Koji Imayoshi, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 0 days.

(21) Appl. No.: 16/872,787

(22) Filed: May 12, 2020

(65) Prior Publication Data

US 2020/0275548 A1 Aug. 27, 2020

Related U.S. Application Data

(63) Continuation of application No. PCT/JP2018/044778, filed on Dec. 5, 2018.

(30) Foreign Application Priority Data

Dec. 6, 2017 (JP) ............................ JP2017-234558

(51) Int. Cl.
*H05K 1/16* (2006.01)
*H05K 1/02* (2006.01)
(Continued)

(52) U.S. Cl.
CPC ......... *H05K 1/0233* (2013.01); *H05K 1/0231* (2013.01); *H05K 1/0306* (2013.01); *H05K 1/16* (2013.01); *H05K 1/185* (2013.01)

(58) Field of Classification Search
CPC ................................ H05K 1/16; H05K 1/165
See application file for complete search history.

(56) References Cited

U.S. PATENT DOCUMENTS 4,299,873 A * 11/1981 Ogihara .................... B32B 3/10 428/137
2003/0168727 A1* 9/2003 Kimura ............... H01L 23/5385 257/700

(Continued)

FOREIGN PATENT DOCUMENTS

JP 2001-126946 A 5/2001
JP 2006-060119 A 3/2006

(Continued)

OTHER PUBLICATIONS

International Searching Authority, "International Search Report," issued in connection with International Patent Application No. PCT/JP2018/044778, dated Mar. 5, 2019.

(Continued)

*Primary Examiner* — Jeremy C Norris
(74) *Attorney, Agent, or Firm* — Foley & Lardner LLP

(57) ABSTRACT

A glass wiring board is provided with an analog duplexer including an inductor and a capacitor, and includes: a core wiring board provided with the coil-shaped inductor having through electrodes and wiring patterns provided in a glass substrate via an inorganic adhesive layer, and with a land pattern connected to an outer layer; the capacitor having a structure with a dielectric layer sandwiched between upper and lower electrode patterns on an insulating resin layer covering the core wiring board; and a wiring pattern for connecting to an external component such as an external substrate.

10 Claims, 3 Drawing Sheets

300
5
11
3
4
7 8 9
303
302
10
100

(51) Int. Cl.

| | |
|---|---|
| ***H05K 1/03*** | (2006.01) |
| ***H05K 1/18*** | (2006.01) |

(56) References Cited

U.S. PATENT DOCUMENTS

| | | | | |
|---|---|---|---|---|
| 2007/0126529 | A1 | 6/2007 | Chen | |
| 2014/0035892 | A1 | 2/2014 | Shenoy et al. | |
| 2014/0104284 | A1 | 4/2014 | Shenoy et al. | |
| 2017/0162319 | A1* | 6/2017 | Otani | H01G 4/252 |

FOREIGN PATENT DOCUMENTS

| | | | |
|---|---|---|---|
| JP | 2009-518953 | A | 5/2009 |
| JP | 2016-502261 | A | 1/2016 |
| JP | 2017-073424 | A | 4/2017 |
| WO | WO-2013/164926 | A1 | 11/2013 |

OTHER PUBLICATIONS

International Searching Authority, “Written Opinion,” issued in connection with International Patent Application No. PCT/JP2018/044778, dated Mar. 5, 2019.

Extended European Search Report dated Dec. 4, 2020 for corresponding European Patent Application No. 18886318.7.

* cited by examiner

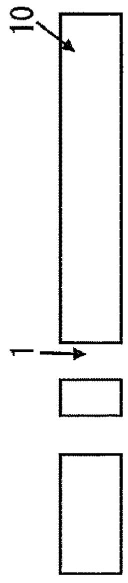
FIG. 5(a)
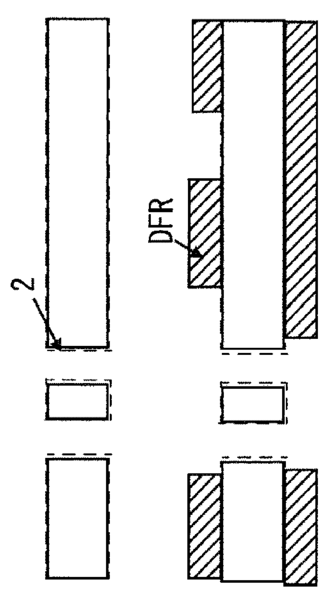
FIG. 5(b)
FIG. 5(c)
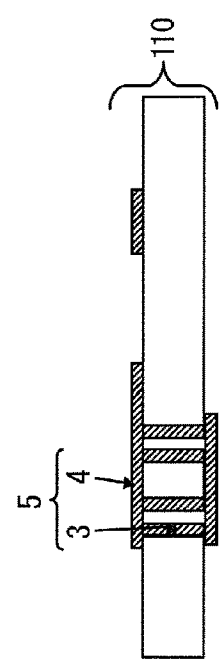
FIG. 5(d)
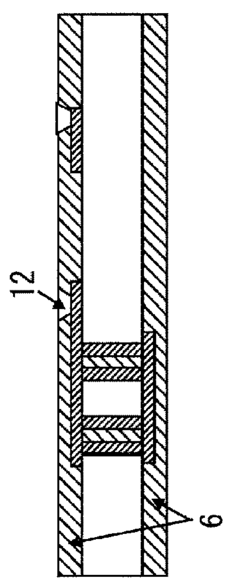
FIG. 5(e)
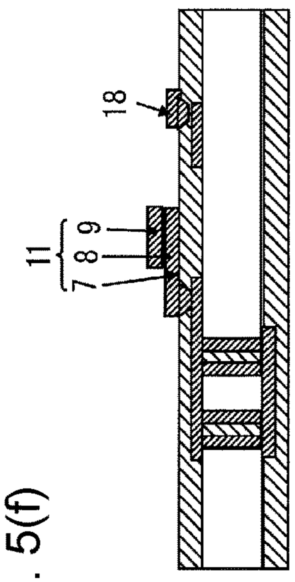
FIG. 5(f)
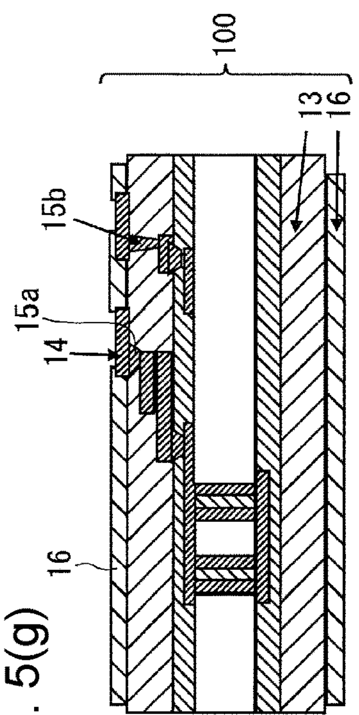
FIG. 5(g)

WIRING BOARD, SEMICONDUCTOR DEVICE, AND METHOD OF MANUFACTURING WIRING BOARD

CROSS-REFERENCE TO RELATED PATENT APPLICATIONS

This application is a continuation application filed under 35 U.S.C. § 111(a) claiming the benefit under 35 U.S.C. §§ 120 and 365(c) of International Patent Application No. PCT/JP2018/044778, filed on Dec. 5, 2018, which is based upon and claims the benefit of priority to Japanese Patent Application No. 2017-234558, filed on Dec. 6, 2017, the disclosures of which are all incorporated herein by reference in their entireties.

TECHNICAL FIELD

The present invention relates to a wiring board, a semiconductor device, and a method of manufacturing the wiring board.

BACKGROUND ART

In mobile (cellular) communication, the advent of innovative technologies such as Long Term Evolution (LTE) and carrier aggregation has increased the need for installation of more analog duplexers (diplexers) with higher accuracy that include an inductor component and a capacitor component.

Diplexers have been conventionally fabricated using a substrate formed of a ceramic material, but the rapid development of electronic devices such as smartphones nowadays has also accelerated the need for diplexers that filter higher frequencies. However, it is challenging to reduce the size and improve the characteristics of diplexers made of traditional ceramic substrates. This is because the capacitor has surface irregularities that cause variation in characteristics, and an inductor wiring formed of a conductive material has surface irregularities that cause high electrical resistance on the skin part thereof.

In recent years, attention has centered on development of a high-frequency filter substrate obtained by applying wiring technology to a silicon substrate or a glass substrate. Such silicon or glass substrates can improve the characteristics of diplexers. This is because the irregularities of the wiring surface and thus the electrical resistance of the skin part can be reduced by smoothing the surfaces of capacitor electrodes in a manner to follow the smoothness of the substrate, and forming the inductor wiring by electroplating.

The high-frequency filter substrate may also have through electrodes referred to as through-silicon vias (TSVs) or through-glass vias (TGVs), which are formed by making fine through holes in the substrate and filling the holes with a conductive substance. The through electrodes and wirings that electrically connect the through electrodes can be used to form a coil shape and also provide inductor wiring that has a 3D structure having the substrate material as the core.

The characteristics of the capacitor are allowed to be controlled by forming an optimum dielectric material on a high-frequency filter substrate by vacuum deposition used in semiconductor technology and flat panel technology, and providing upper and lower electrodes arranged to hold the dielectric material between them.

Silicon wiring boards and glass wiring boards will now be compared with each other. Silicon wiring boards are more suitable to micromachining than glass wiring boards, and have wiring processes and TSV formation processes that have been already established. However, silicon wiring boards have the drawback of being costly because of an inability to take them from the circumferential part of an inevitably circular silicon wafer and an inability to produce them in batches from a large wafer.

In contrast, glass wiring boards allow batch production from a large panel and may also be produced in a roll-to-roll process, leading to a significant cost reduction. The through holes in a glass wiring board are formed by electrical discharge machining, laser processing, and hydrofluoric acid processing, whereas the through holes in a silicon wiring board are formed by gas etching. The longer processing time and wafer thinning process cause higher cost.

In terms of electrical characteristics, silicon substrates are semiconductor materials. To form wiring, silicon substrates need the formation of $SiO_2$ or other dielectric films, which have insulation properties. Thus, attention has centered on forming a diplexer with a glass substrate, which is an insulating material.

As described above, a glass substrate allows a glass wiring board to be produced inexpensively. However, as dimension designs for inductor coils require thinner and thinner glass substrates, the glass substrates disadvantageously become more breakable in handling while being manufactured.

The glass substrate used for a glass wiring board has a thickness of 50 μm or more and 1000 μm or less. In this range, the range of 400 μm or more and 1000 μm or less is typically used for flat-panel displays. A glass wiring board with such a thickness has a structure in which a wiring pattern is laminated on one side of the glass substrate. The glass wiring board can be handled in a stable manner by holding edges or suction on the reverse side of the glass substrate.

Semiconductor packages for glass wiring boards are required to be smaller and thinner. Accordingly, there is a growing need for glass wiring boards having thicknesses of 50 μm or more and 400 μm or less, and wiring patterns are required to be laminated on both sides of a glass substrate.

A thinner glass substrate bends more under its own weight. Furthermore, handling a thinner glass substrate is challenging. For example, after a distortion occurs, the glass substrate may break from a crack, if any. A glass wiring board has through holes with a diameter of 10 μm or more and 200 μm to some hundreds of micrometers or less formed in a glass substrate with a thickness of 50 μm or more and 400 μm or less. The through holes have conductive through electrodes formed in them, whereas the glass substrate has wiring patterns formed on the front and back surfaces, and the through electrodes and the wiring patterns are electrically connected to form a wiring circuit board.

The wiring patterns may be formed of conductive metal thin films such as sputtered films. In other cases, to reduce the wiring resistance, the wiring patterns may be formed of electrolytic copper plating for thicker wiring.

When a wiring pattern is formed on a glass substrate, an inorganic adhesive layer having adhesion to the glass substrate is formed, and the wiring pattern is formed on the inorganic adhesive layer (e.g., see Patent Literature 1). The inorganic adhesive layer may be titanium, chromium, or chromium-copper alloy, which has good properties of adhesion to the glass substrate.

[Citation List] [Patent Literature] [PTL 1] JP 2006-60119 A

SUMMARY OF THE INVENTION

Technical Problem

When inductor wiring and the lower electrode of a capacitor are formed in the same layer on a glass substrate, a first layer formation step includes forming the through electrodes, the wiring patterns of the inductor, and the lower electrode of the capacitor. A second layer formation step includes forming a dielectric layer on the lower electrode of the capacitor, followed by an upper electrode. Then, the unrequired conductive area is removed by etching to complete the inductor pattern and the capacitor pattern. A process including these steps is known.

In this process, two wiring patterns and one dielectric layer pattern are formed in layers immediately above the glass. Thus, as the stress of the wiring patterns accumulates, the glass substrate being handled becomes more fragile. In some cases, the concentration of stress on the interface between the glass substrate and the wiring patterns in each step may cause cracking of the glass substrate. In other cases, contact between the surface of the glass substrate and an external object produces a crack that is a starting point of breakage.

Furthermore, when the upper electrode pattern of the capacitor is etched in the seed layer, and the lower electrode pattern of the capacitor is etched in the seed layer, the upper electrode pattern is etched twice. This etching varies the effective electrode area of the capacitor, thus causing the problem of variation in the electrical characteristics of the capacitor.

For a capacitor having a lower electrode electroplated on an insulating resin layer formed of an organic resin, the electroplated film is formed on the surface irregularities of the insulating resin layer, and the lower electrode has, on its surface, an overlap between bumps on the electroplated film and the surface irregularities of the insulating resin layer. This causes problems of a difference between the area of the capacitor electrode surface and its designed value, and the occurrence of a short circuit between the lower electrode and the upper electrode.

An object of the present invention is to provide a wiring board that has a circuit including an inductor and a capacitor, a semiconductor device, and a method of manufacturing the wiring board. Even if a thin glass substrate is used as a core substrate, no glass breakage occurs during the manufacturing process of the wiring board, and this allows the capacitor to exhibit stable electrical characteristics.

Solution to Problem

An aspect of the present invention provides a wiring board provided with a circuit including an inductor and a capacitor. The wiring board includes: a core wiring board provided with a coil-shaped inductor having a through electrode and a wiring pattern and arranged in a core substrate via an inorganic adhesive layer, and with a land pattern provided on the core substrate and connected to an outer layer; insulating resin layers covering both surfaces of the core wiring board; a capacitor provided on one of the insulating resin layers on one side of the core wiring board and having a structure with a dielectric layer sandwiched between an upper electrode pattern and a lower electrode pattern electrically connecting to the wiring pattern of the inductor; and a wiring pattern for connecting to an external substrate. The wiring pattern is electrically connected to the land pattern and provided on the insulating resin layer.

Another aspect of the present invention provides a semiconductor device including: a wiring board according to the above aspect; and a semiconductor chip mounted on the wiring board.

Still another aspect of the present invention provides a method of manufacturing a wiring board. The method includes: forming a through hole in a core substrate; forming an inorganic adhesive layer on a surface of the core substrate including the inside of the through hole, forming on the inorganic adhesive layer a land pattern for connecting to an inductor and an outer layer, and then removing an area of the inorganic adhesive layer on which neither the inductor nor the land pattern is stacked; after removing the area of the inorganic adhesive layer, covering with insulating resin both surfaces of the core substrate on which the inductor and the land pattern are formed, and forming, in the insulating resin, an opening for electrically connecting to the inductor and the land pattern; forming, on the insulating resin, a capacitor having a lower electrode pattern electrically connecting to the inductor via the opening, a dielectric layer, and an upper electrode pattern stacked in this order, and forming an external connection wiring pattern electrically connecting to the land pattern via the opening to connect to an external substrate; and stacking an insulating resin to cover the capacitor and the external connection wiring pattern, and forming, in the insulating resin, an opening for electrically connecting to the upper electrode pattern of the capacitor and the external connection wiring pattern.

Advantageous Effects of Invention

An aspect of the present invention provides a wiring board that, even if a thin glass substrate is used as its core substrate, suffers no glass breakage during the manufacturing process thereof and includes a circuit allowing a capacitor to exhibit stable electrical characteristics.

BRIEF DESCRIPTION OF DRAWINGS

FIGS. 5(*a*), 5(*b*), 5(*c*), 5(*d*), 5(*e*), 5(*f*), and 5(*g*) are process diagrams illustrating an example process of manufacturing the glass wiring board according to the first embodiment.

DETAILED DESCRIPTION

Figure 1:
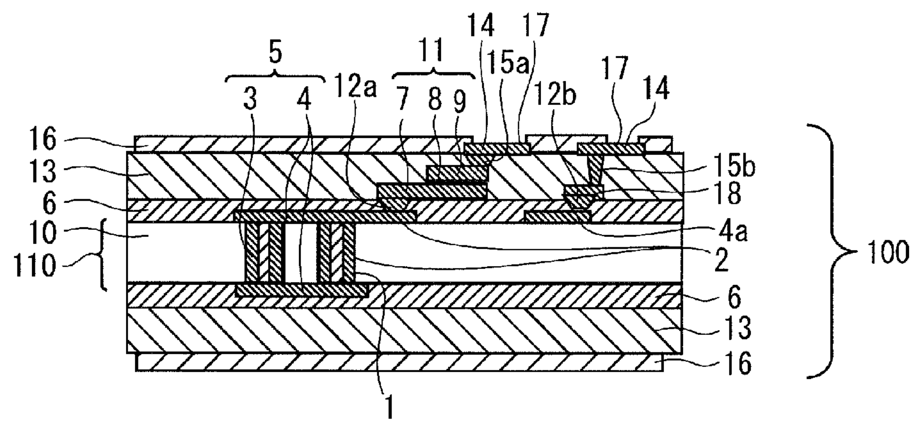
FIG. 1 is a schematic cross-sectional view of an example of a glass wiring board according to a first embodiment.

With reference to the accompanying Figures, a description will now be given of representative embodiments according to the present invention. The present invention is not limited to the following representative embodiments, and appropriate modifications can be made without departing from the spirit of the present invention. The representative embodiments described below are merely examples of the present invention, and the design thereof could be appropriately changed by one skilled in the art. Here, the drawings are schematic, and the relationship between thickness and plane size, the ratio of the thickness of each layer, etc., may be different from actual ones. The embodiments described below are merely examples of the configurations for embodying the technical idea of the present invention, and the technical idea of the present invention should not limit the materials, shapes, structures, and the like of the components to those described below. The technical idea of the present invention can be modified in various ways within the technical scope specified by the claims.

The same constituent elements are denoted by the same reference numerals unless there is a reason for the sake of convenience, and redundant description is omitted. In the drawings referred to in the following description, for clarity, characteristic parts are enlarged, and thus the components are not shown to scale. It is, however, clear that one or more embodiments can be implemented without such details. In addition, known structures and devices may be schematically represented for simplicity.

First Embodiment

FIG. 1 is a schematic cross-sectional view of an example of a glass wiring board 100 that is a wiring board according to a first embodiment.

The glass wiring board 100 according to the first embodiment, as shown in FIG. 1, includes a glass substrate 10 having multiple through holes 1, an inorganic adhesive layer 2 formed on the surface of the glass substrate 10, and an inductor 5 including through electrodes 3 and wiring patterns 4. The through electrodes 3 are formed to be tubular and on the inner periphery of the through holes 1 via the inorganic adhesive layer 2. The wiring patterns 4 are formed on both surfaces of the glass substrate 10 via the inorganic adhesive layer 2 and electrically connected to the through electrodes 3 on both the surfaces of the glass substrate 10.

The glass wiring board 100 also includes insulating resin layers 6 stacked in a manner to enclose the wiring patterns 4 on both the surfaces of the glass substrate 10, and a capacitor 11 formed on one of the insulating resin layers 6 on one side of the glass wiring board 100 and having a lower electrode pattern 7, a dielectric layer 8, and an upper electrode pattern 9 stacked in this order. The wiring pattern 4 and the lower electrode pattern 7 are electrically connected to each other through a conductive via 12*a* formed in the insulating resin layer 6. The glass substrate 10 also has a land pattern 4*a* formed on the surface on which the capacitor 11 is formed, and the land pattern 4*a* is electrically connected to the wiring pattern 4. The land pattern 4*a* is electrically connected to a wiring pattern 18 formed on the insulating resin layer 6 through a conductive via 12*b* formed in the insulating resin layer 6.

In addition, an insulating resin layer 13 thick enough to enclose the capacitor 11 is stacked on each of the insulating resin layers 6 on both the surfaces of the glass substrate 10. The insulating resin layer 13 in which the capacitor 11 is formed has a wiring pattern 14 on it for connecting to an external component. The insulating resin layer 13 in which the capacitor 11 is formed has conductive vias 15*a*, 15*b* formed in it. The upper electrode pattern 9 and the wiring pattern 14 are electrically connected to each other through the conductive via 15*a*. The wiring pattern 18 and the wiring pattern 14 are electrically connected to each other through the conductive via 15*b*.

Each of the insulating resin layers 13 on both the surfaces of the glass substrate 10 has a solder resist layer 16 formed on it. On the insulating resin layer 13 of the glass substrate 10 on which the wiring pattern 14 is formed, the solder resist layer 16 is formed without covering a part of the surface of the wiring pattern 14. The exposed area of the wiring pattern 14 serves as a connection electrode portion 17 for an external component.

Figure 2:
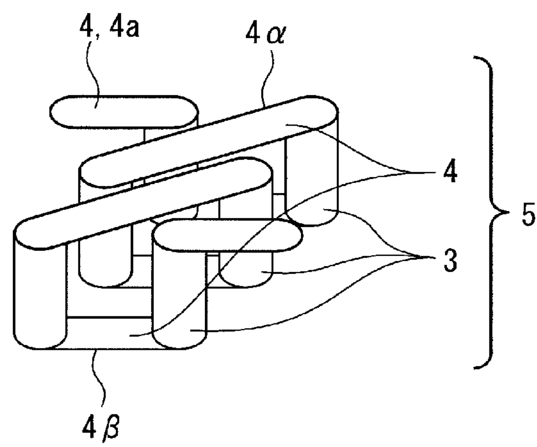
FIG. 2 is a schematic perspective view of an example inductor.

FIG. 2 is a schematic perspective view of an example structure of the inductor 5. The inductor 5 includes the inorganic adhesive layer 2 formed on the inner walls of the through holes 1 provided in the glass substrate 10 by one or two methods of laser processing, electrical discharge machining, and glass etching, and also formed on both the surfaces of the glass substrate 10 by sputtering or electroless plating. The inorganic adhesive layer 2 has conductivity and adhesion to glass. The inductor 5 further includes, on the inorganic adhesive layer 2, the through electrodes 3 and the wiring patterns 4 on both the surfaces of the glass substrate 10 formed by electroplating, electroless plating, or screen printing. The inductor 5 has a solenoid inductor structure in which the wiring patterns 4 on both the surfaces of the glass substrate 10 are electrically connected to each other via the through electrodes 3.

The glass substrate 10 also has the land pattern 4*a* on it connected to the wiring pattern 4 and electrically connected to the conductive via 12*b* for connecting to an outer layer. The term "outer layer" as used herein refers to the lower electrode pattern 7 and the wiring pattern 18 formed on the insulating resin layer 6.

The inorganic adhesive layer 2 is interposed between the through electrodes 3 and the glass substrate 10, and also between the glass substrate 10 and each of the wiring patterns 4 and the land pattern 4*a*. The other part of the inorganic adhesive layer 2 is removed by dry etching or wet etching to prevent a short circuit between the wiring patterns 4.

The capacitor 11, as shown in FIG. 1, includes the lower electrode pattern 7 formed on the insulating resin layer 6 by sputtering, electroless plating, or electroplating, the dielectric layer 8 formed on the lower electrode pattern 7 by chemical vapor deposition (CVD), sputtering, or screen printing, and the upper electrode pattern 9 formed on the dielectric layer 8 by electroless plating or electroplating, with the dielectric layer 8 sandwiched between the lower electrode pattern 7 and the upper electrode pattern 9.

Among the methods mentioned above, the lower electrode pattern 7 and the upper electrode pattern 9 are desirably formed by electroplating using a semi-additive process, in terms of cross sections and dimension control of the lower electrode pattern 7 and the upper electrode pattern 9. The seed layer may be formed by electroless plating or may be a sputtered film.

When the seed layer is formed on the insulating resin layer 6 by electroless plating, the surface of the insulating resin layer 6 is roughened using UV processing or an alkaline treatment solution to achieve an arithmetic surface roughness Ra of about 50 nm or more and 300 nm or less, improving the adhesion to the seed layer. For the lower electrode pattern 7 and the upper electrode pattern 9 that are formed by electroplating, the arithmetic surface roughness Ra of the plating surface of the lower electrode pattern 7 is adjusted to 50 nm or more and 150 nm or less because of adjoining metal bumps.

If the seed layer is formed of a sputtered film, a plasma treatment prior to sputtering provides adhesion to the insulating resin layer 6, thus allowing the seed layer to be formed with an arithmetic surface roughness Ra of 50 nm or less.

The surfaces of the lower electrode pattern 7 and the upper electrode pattern 9 formed by electroplating may be smoothed by polishing with abrasive particles, chemical polishing with a chemical solution, or cutting with a grinder.

When one or more of the methods described above are used to reduce the surface irregularities of one or both of the insulating resin layer 6 and the lower electrode pattern 7, the arithmetic surface roughness Ra of the lower electrode pattern 7 may be reduced to 150 nm or less. This roughness reduces the risk of a short circuit occurring between the upper and the lower electrode patterns.

If the arithmetic surface roughness Ra of the lower electrode pattern 7 exceeds 150 nm, variations in the electrical characteristics of the capacitor 11 and the occurrence of an electrical short between the lower electrode pattern 7 and the upper electrode pattern 9 will be pronounced. If the arithmetic surface roughness Ra of the lower electrode pattern 7 exceeds 200 nm, the thickness of the formed dielectric layer 8 will have greater variations, increasing variations in the electrical characteristics of the capacitor 11 and the number of occurrences of electrical shorts between the lower electrode pattern 7 and the upper electrode pattern 9. The arithmetic surface roughness Ra of the lower electrode pattern 7 was measured with a laser interferometer.

The dielectric layer 8 may be removed except the part overlapping the lower electrode pattern 7. The removal may be achieved by dry etching or wet etching using the upper electrode pattern 9 as a masking material. In other cases, the removal may be achieved by dry etching or wet etching over a masking material including a photosensitive material formed to cover the upper electrode pattern 9.

(Structure of Glass Wiring Board)

As shown in FIG. 1, the glass wiring board 100 according to the present embodiment is a wiring circuit board with a high-frequency filter including the inductor 5 and the capacitor 11. The glass wiring board 100 includes a core wiring board 110 having the coil-shaped inductor 5 including the through electrodes 3 and the wiring patterns 4 provided in the glass substrate 10 via the inorganic adhesive layer 2, and the land pattern 4*a* for connecting to the outer layer. The glass wiring board 100 also includes, on the insulating resin layer 6 with which the core wiring board 110 is covered, the capacitor 11 having the dielectric layer 8 sandwiched between the upper and lower electrode patterns 7 and 9, and the wiring pattern 14 for connecting to an external component such as an external substrate.

(Thickness of Core Wiring Board)

The core wiring board 110 includes the glass substrate 10 with a thickness of 50 μm or more and 1000 μm or less, and the thickness of the glass substrate 10 defines the wiring length of the through electrodes 3 in the inductor 5. The number of through electrodes 3 electrically connected to the upper and lower electrode patterns 7 and 9 may define the number of turns of the inductor 5. The wiring length and the number of turns of the inductor 5 may not be limited but be determined in accordance with the characteristics of the intended inductor 5.

(Shapes of Through Hole and Through Electrode)

The through holes 1 have the maximum diameter at their upper and lower ends. The maximum diameter is determined depending on the thickness of the glass substrate 10, the method of forming the through holes 1, and the wiring width of the wiring patterns 4 of the inductor 5. Examples of the method of forming the through holes 1 include, but are not limited to, methods using CO2 lasers (carbon dioxide lasers), short pulse lasers, and electrical discharge machining. The through holes 1 may also be formed by etching with a hydrofluoric acid based solution.

To achieve a highly circular processed shape, the through holes 1 are desirably formed by concentrating laser energy on the glass substrate 10 using CO2 lasers or electrical discharge machining. In this processing, the diameter of the through holes 1 depends on the laser energy that has passed through the glass substrate 10. The diameter of the through holes 1 decreases as the thickness of the glass substrate 10 increases.

A laser-modified layer of the glass substrate 10 may be etched using a hydrofluoric acid based solution to form through holes. The diameter of the through holes can be adjusted by changing the etching time.

Similarly, the through holes can be formed by laser and electrical discharge machining followed by etching with a hydrofluoric acid based solution. The diameter of the through holes can be adjusted by changing the etching time.

As shown in FIG. 2, the wiring patterns 4 of the inductor 5 include straight patterns 4*a* on the surface adjacent to the capacitor for electrically connecting neighboring through electrodes 3, straight patterns 4β on the reverse surface, and the lead wire pattern 4*a* from the inductor 5. To avoid an unnecessary increase in resistance of the wiring patterns 4 of the inductor 5, the land patterns 4α and the straight patterns 4β desirably have the same dimensions or a minimized dimensional difference. The through holes 1 may have the maximum diameter of 15 μm or more and 150 μm or less. When a method such as CO2 laser or electrical discharge machining is used to form through holes in the glass substrate 10, the through holes may have a diameter of desirably 100 μm or less in terms of machinability by the method such as CO2 laser or electrical discharge machining. The through holes 1 with a diameter exceeding 150 μm are undesirable because such a diameter needs the inductor 5 to have accordingly large dimensions, leading to an increase in the size of a diplexer.

(Structure of Inductor)

The wiring patterns 4 of the inductor 5 may have a thickness of 1 μm or less, which provides an adhesive effect between the inorganic adhesive layer 2 and the wiring patterns 4 by forming the inorganic adhesive layer 2 as a conductive metal thin film.

The wiring patterns 4 may also be thickened by electroplating to reduce the wiring resistance of the wiring patterns 4. However, when the wiring patterns 4 are formed on the surfaces of the glass substrate 10, the film stress may increase with increasing thickness of the wiring patterns 4 and cause glass cracking in the interface between the wiring patterns 4 and the glass substrate 10. Such glass cracking may occur with an electroplated film thickness of 30 μm and a film stress of 2600 N/m, while it may be avoided with an electroplated film thickness of 25 μm and a film stress of 2000 N/m or less.

The inductor 5 is a solenoid coil and electrically connects the through electrodes 3 and the wiring patterns 4.

(Material for Inorganic Adhesive Layer)

The inorganic adhesive layer 2 may be a single-layer film of a single material selected from, or a single-layer or multilayered film of a combination of two or more materials selected from tin oxide, indium oxide, zinc oxide, nickel, nickel-phosphorus, chromium, chromium oxide, aluminum nitride, copper nitride, aluminum oxide, tantalum, titanium, and copper. Examples of formation methods include, but are not limited to, wet coating, sputtering, CVD, electroless plating, and various other film deposition methods that allow adhesion to the glass substrate 10 and formation on the inner walls of the through holes 1 without clogging.

(Material for Through Electrode and Wiring Pattern)

The through electrodes 3, the wiring patterns 4, and the land pattern 4*a* may be made of a single metal selected from, or an alloy or a multilayered film of two or more metals selected from aluminum, copper, chromium, titanium, silver, gold, nickel, platinum, palladium, ruthenium, tin, tin-silver, tin-silver-copper, tin-copper, tin-bismuth, and tin-lead.

The through electrodes 3 may be deposited by any method. However, the through electrodes 3 are desirably formed by electroplating, electroless plating, or screen printing to reduce their wiring resistance and provide electrical bonding with wiring of an external substrate.

The wiring patterns 4 may be formed by a semi-additive process using electroplating or a subtractive process subsequent to electroplating.

The part of the wiring patterns 4 that is electrically bonded to the wiring of the external substrate and the land pattern 4*a* may be provided by forming conductive surfaces on predetermined areas of the wiring patterns 4 using electroless plating or screen printing.

The dielectric layer 8 may be made from any combination of any one metal of aluminum, copper, chromium, titanium, silver, gold, nickel, platinum, palladium, ruthenium, and tantalum, oxides, nitrides, and alloys of these metals, and polysilicon.

The material for the dielectric layer 8 is sandwiched between the lower electrode pattern 7 and the upper electrode pattern 9 to form the capacitor structure.

(Material for Insulating Resin Layer)

The insulating resin layers 6 covering the core wiring board 110 may be made of any one material of or a composite of at least two materials of epoxy resin, phenolic resin, polyimide resin, cycloolefin, PBO resin, and acrylic resin. Thermosetting resin or photocurable resin may also be used.

When the insulating resin layers 6 having a Young's modulus of 2 GPa or more and 15 GPa or less are used to cover both the surfaces of the core wiring board 110, the stress of the wiring patterns 4 disperses into the insulating resin layers 6 in contact with the wiring patterns 4. The dispersion prevents cracking of the glass substrate 10 caused by the stress of the wiring patterns 4 concentrating on the interface between the glass substrate 10 and the lower electrode pattern 7. In addition, when the thin glass substrate 10 is covered with the insulating resin layers 6 at early stages in the process of producing the glass wiring board 100, the glass core substrate (the glass substrate 10) can avoid glass breakage during handling by distributing external stress and concentrated external force that may cause glass breakage due to distortion.

The glass substrate has a Young's modulus of about 80 GPa. Among metal materials, copper has a Young's modulus of about 130 GPa, titanium about 107 GPa, and nickel about 200 GPa. If the wiring patterns have a Young's modulus higher than that of the glass substrate, the core wiring board 110 has a difference in bendability and flexibility depending on the presence or absence of the wiring patterns. Thus, the insulating resin layers 6 covering the core wiring board 110 desirably have a Young's modulus equal to or lower than that of the glass substrate. In particular, the use of insulating resin layers 6 that have a Young's modulus of less than 15 GPa enables the stress of the wiring patterns 4 to be dispersed and the glass substrate to be provided with bendability and flexibility. Although the lower limit of the Young's modulus is not particularly limited, a Young's modulus higher than 2 GP enables the insulating resin layers 6 to provide a stress reduction effect. The Young's modulus of the insulating resin layers 6 was measured in accordance with JIS K7127.

(Structure of Capacitor)

The lower electrode pattern 7 and the upper electrode pattern 9 may be made of any one single metal or a compound of two or more metals of copper, silver, gold, nickel, platinum, palladium, ruthenium, tin, tin-silver, tin-silver-copper, tin-copper, tin-bismuth, and tin-lead.

The lower electrode pattern 7 and the upper electrode pattern 9 may be deposited by any method. However, the lower electrode pattern 7 and the upper electrode pattern 9 are desirably formed by electroplating or electroless plating to reduce their wiring resistance.

The wiring patterns may be formed by a semi-additive process using electroplating or a subtractive process subsequent to electroplating. The part of the upper electrode pattern 9 that is electrically bonded to the wiring of the external substrate may be provided by forming a conductive surface on an intended area of the upper electrode pattern 9 using electroless plating or screen printing.

The dielectric layer 8 may be selected from any combinations including oxides, nitrides, alloys, and polysilicon nitrides such as silicon oxide, silicon nitride, barium titanate, strontium, tantalum pentoxide, lead zirconium titanate, strontium titanate, aluminum oxide, benzocyclobutane resin, cardo resin, and polyimide resin.

The dielectric layer 8 may be formed by various film deposition methods such as CVD, sputtering, and screen printing.

The dielectric material is sandwiched between the lower electrode pattern 7 and the upper electrode pattern 9 to provide the capacitor structure.

(Method of Manufacturing Glass Wiring Board)

A method of manufacturing the glass wiring board according to the present embodiment includes a through hole forming step for forming the through holes 1 in the glass substrate 10, a step for forming the core wiring board 110 by forming the inorganic adhesive layer 2 on the surface of the glass substrate 10, and thereon the inductor 5 and the land pattern 4*a* for connecting to the outer layer, a step for covering both the surfaces of the core wiring board 110 with the insulating resin layers 6 and forming openings to be the conductive vias 12*a*, 12*b* for electrically connecting to the wiring patterns 4 and the land pattern 4*a* on the surfaces of the core wiring board 110, a step for forming, on one of the insulating resin layers 6 on one side of the core wiring board 110, the capacitor 11 including the lower electrode pattern 7, the dielectric layer 8, and the upper electrode pattern 9 and the wiring pattern 18 for connecting to the external substrate, and a step for stacking the insulating resin layer 13 on the capacitor 11 and the wiring pattern 18 and forming openings in intended parts of the insulating resin layer 13.

The insulating resin layer 13 may be formed of the same material as the insulating resin layers 6 covering the core wiring board 110. The insulating resin layer 13 may also be a solder resist or other insulating resin layer used as an outer layer material. The number of insulating resin layers and the total number of wiring patterns formed on them are not particularly limited but may be selected as appropriate in accordance with the product design.

As described, the glass wiring board 100 according to an embodiment of the present invention has the core wiring board 110 provided by forming, on the glass substrate 10, the inductor 5 including the through electrodes 3 and the wiring patterns 4, and also the land pattern 4*a* on the glass substrate 10 for connecting to the external substrate. In this state, the inorganic adhesive layer 2 is formed on the glass substrate 10, and the through electrodes 3, the wiring patterns 4 of the inductor 5, and the land pattern 4*a* are stacked on the inorganic adhesive layer 2. Then, the inorganic adhesive layer 2 is etched to form the core wiring board 110. The resultant core wiring board 110 is covered with the insulating resin layers 6 before the capacitor 11 is formed. More specifically, the inductor 5 is formed using the through electrodes 3 in the glass substrate 10, the core wiring board 110 with the inductor 5 formed is covered with the insulating resin, and the capacitor 11 is formed on this insulating resin layer 6. In this manner, the inductor 5 and the capacitor 11 are formed in different layers.

The core wiring board 110 covered with the insulating resin layers 6 in this manner enables the glass substrate 10 to avoid concentration of external force that may lead to glass breakage. In the process of forming the glass wiring board 100, the covering reduces the risk of breakage of the glass substrate 10 after the step for forming the capacitor 11.

The inductor 5 and the capacitor 11 are arranged in different layers, with the inductor 5 formed on the glass substrate 10 and with the capacitor 11 formed on the insulating resin layer 6, and the inductor 5 and the capacitor 11 are formed in different steps. This formation minimizes the amount of side etching on the dielectric layer 8 of the capacitor 11 and the inorganic adhesive layer 2 as a seed layer on the dielectric layer 8. This allows the upper electrode pattern 9 and other areas to avoid being overetched in the etching process. More specifically, overetching is prevented to avoid the capacitor 11 from having undesirable electrical characteristics, and the electrical characteristics can be controlled in a stable manner.

Additionally, the surface irregularities of the insulating resin layer 6 on which the capacitor 11 is formed are reduced. The surface irregularities of the lower electrode pattern 7 are also reduced so that the lower electrode pattern 7 has an arithmetic surface roughness Ra of 150 nm or less. This smoothing prevents surface irregularities on the lower electrode pattern 7 from varying the areas of the surfaces of the lower electrode pattern 7 and the upper electrode pattern 9 from their designed values, thus avoiding having undesirable electrical characteristics of the capacitor 11. As a result, the electrical characteristics of the capacitor 11 can be controlled in a stable manner, and electrical shorts can be avoided between the lower electrode pattern 7 and the upper electrode pattern 9.

In the first embodiment described above, a glass wiring board is produced using a glass substrate as a core substrate. However, the core substrate may be not only a glass substrate but also a quartz, a silicon wafer, or other substrate.

Also in the first embodiment described above, the present invention is applied to a glass wiring board provided with a diplexer having a high-frequency filter including the capacitor 11 and the inductor 5. However, the invention may be applied to a glass wiring board provided with not only a diplexer but also other circuit including the capacitor 11 and the inductor 5, such as a band-pass filter or a transmitter.

Second Embodiment (Structure of Semiconductor Device)

The glass wiring board 100 illustrated in FIG. 1 may have components such as a semiconductor chip, a capacitor, and an inductor mounted on it. A semiconductor device may have a structure with the glass wiring board 100 mounted on another wiring board.

The glass wiring board 100 described below forms a diplexer with a glass substrate used as its core substrate.

Figure 3:
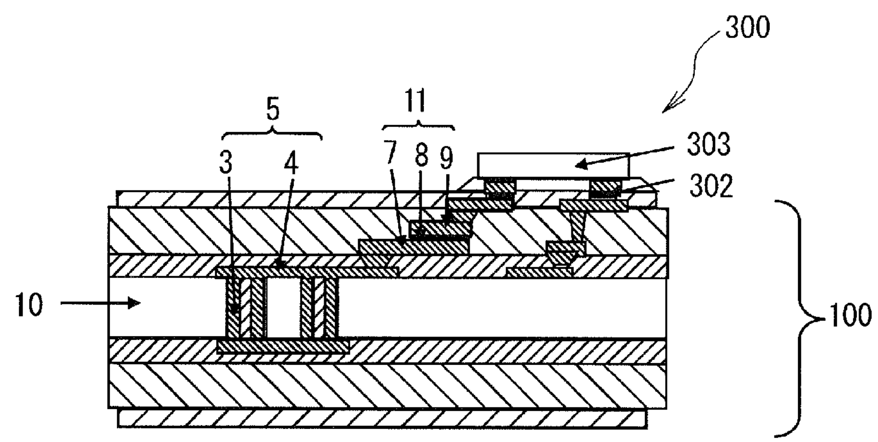
FIG. 3 is a schematic cross-sectional view of an example semiconductor device according to a second embodiment.

FIG. 3 is a schematic cross-sectional view of the structure of a semiconductor device 300 with a semiconductor chip and a chip component 303 mounted on the glass wiring board 100. As shown in FIG. 3, the semiconductor chip and the chip component 303 are mounted on the glass wiring board 100 via, for example, a connection pad 302 to form the semiconductor device 300.

Third Embodiment

Figure 4:
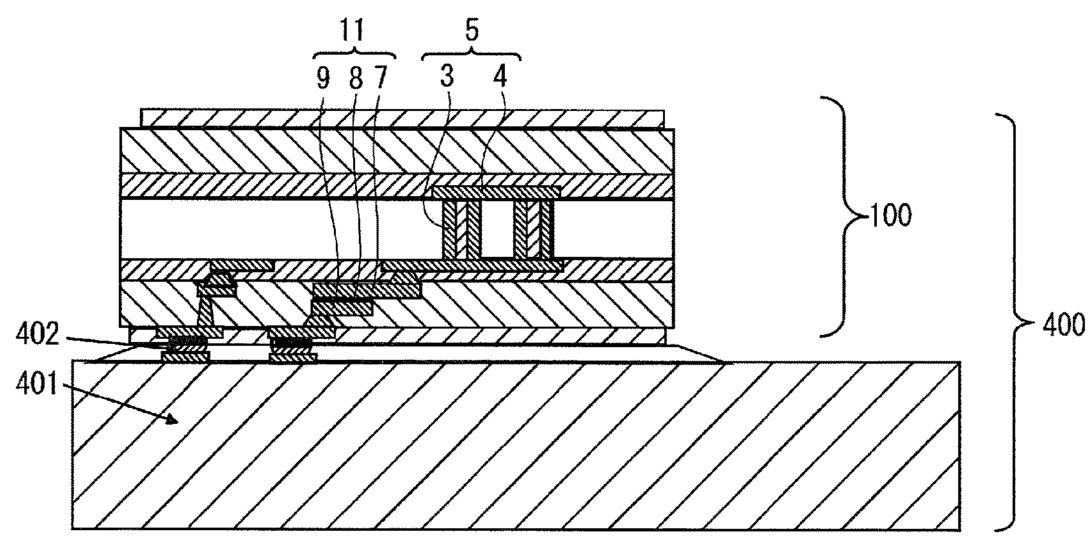
FIG. 4 is a schematic diagram of an example semiconductor device according to a third embodiment.

FIG. 4 is a schematic cross-sectional view of the structure of the glass wiring board 100 illustrated in FIG. 1 and another wiring board 401 mounted on it. As shown in FIG. 4, the glass wiring board 100 is mounted on the wiring board 401 via a connection pad 402 to form a semiconductor device 400.

While some embodiments of the present invention have been described in detail, the invention is not necessarily limited to these embodiments. Modifications without departing from the scope and spirit of the present invention would be encompassed by the present invention.

Example 1

An example will be described hereinafter. In this example, the glass wiring board 100 was produced using a manufacturing method illustrated in FIGS. 5(*a*), 5(*b*), 5(*c*), 5(*d*), 5(*e*), 5(*f*), and 5(*g*) according to the first embodiment.

First, through holes 1 with a diameter of 80 μm were formed in the glass substrate 10 with low expansion (thickness: 300 μm, coefficient of thermal expansion, CTE: 3.5). More specifically, the glass substrate 10 was processed with a short pulse laser in a first process, and the through holes 1 were formed by etching with hydrofluoric acid solution in a second process (see FIG. 5(*a*)).

Next, as the inorganic adhesive layer 2, a Ti film and a Cu film were layered by sputtering on the surface of the glass substrate, and thin sputtered film areas in the through holes 1 were supported by forming an electroless nickel plated film (see FIG. 5(*b*)).

Then, the inorganic adhesive layer 2 was used as a seed layer for forming, by a semi-additive process, the wiring patterns 4 included in the inductor 5 and having the land pattern for connecting to the outer layer. RY-3525 (thickness: 25 μm), which is a dry film resist manufactured by Hitachi Chemical Company, Ltd, was laminated on both the surfaces of the glass substrate 10, and then openings were formed by photolithography (see FIG. 5(*c*)).

Then, the through electrodes 3 and the wiring patterns 4 of the inductor 5 were formed by electrolytic copper plating with a wiring thickness of 15 μm, and unnecessary parts of the seed layer were removed by etching to form the core wiring board 110 (see FIG. 5(*d*)).

Then, both the surfaces of the core wiring board 110 were covered with 25-μm-thick insulating resin layers 6 that were formed of an Ajinomoto Build-up Film (ABF), manufactured by Ajinomoto Fine-Techno Co., Inc, and an opening was provided to form a conductive via 12 for electrically connecting to the wiring pattern 4 on the surface of the core wiring board 110 (see FIG. 5(*e*)).

The surface of the insulating resin layer 6 was treated with an alkaline surface roughening liquid to achieve an arithmetic surface roughness Ra of 60 nm, and electroless copper plating was provided as a seed layer for the lower electrode pattern 7 of the capacitor 11. Then, the lower electrode pattern 7 was formed by a semi-additive process with a wiring thickness of 15 μm. The lower electrode pattern 7 thus obtained had an arithmetic surface roughness Ra of 150 nm.

Next, on the lower electrode pattern 7, a SiN film was formed by CVD as the dielectric layer 8 with a thickness of 400 nm, and a Ti film and a Cu film were formed by sputtering as a seed layer for the upper electrode pattern 9.

Then, the upper electrode pattern 9 was formed by a semi-additive process with a wiring thickness of 10 μm. After that, unnecessary parts of the seed layers and the dielectric layer 8 were removed by wet etching and dry etching, leaving the upper electrode pattern, the dielectric layer 8 serving as the capacitor pattern, and the lower electrode pattern 7, to form the capacitor 11 including the lower electrode pattern 7, the dielectric layer 8, and the upper electrode pattern 9 and the wiring pattern 18 for connecting to the external substrate (see FIG. 5(*f*)).

Next, the capacitor 11 and the wiring pattern 18 were covered with the insulating resin layer 13 having a thickness of 35 μm, and the conductive vias 15*a*, 15*b* were formed for external electrical connection. The insulating resin layer 13 was covered by the wiring pattern 14 with a wiring thickness of 15 μm, and the solder resist layer 16 was formed on the wiring pattern 14. In this manner, the glass wiring board 100 was formed (see FIG. 5(*g*)).

In the present example, although the solder resist layer 16 was stacked on the wiring pattern 14 on the insulating resin layer 13, the number of wiring layers is not particularly limited, and any method may be selected to form the solder resist layer and Ni plating, Au plating, and solder for the openings in the insulating resin layer.

The glass wiring board 100 was produced without glass breakage during the above process. Furthermore, the resultant electrical characteristics of the capacitor matched the designed value, and the capacitor had a smaller number of occurrences of short circuits, providing a diplexer usable at high frequencies.

Industrial Applicability

The glass wiring board according to the present invention and the method of manufacturing the glass wiring board can be used for a semiconductor component including functional elements that are an inductor and a capacitor.

Reference Signs List

1 Through hole; 2 Inorganic adhesive layer; 3 Through electrode; 4 Wiring pattern; 5 Inductor; 6 Insulating resin layer; 7 Lower electrode pattern; 8 Dielectric layer; 9 Upper electrode pattern; 10 Glass substrate; 11 Capacitor; 12*a*, 12*b* Conductive via; 13 Insulating resin layer; 14 Wiring pattern; 15*a*, 15*b* Conductive via; 16 Solder resist layer; 17 Connection electrode portion; 18 Wiring pattern; 100 Glass wiring board; 110 Core wiring board; 302, 402 Connection pad; 303 Chip component; 401 Other wiring board; 403 Semiconductor device;

What is claimed is:

1. A semiconductor device comprising:

an analog duplexer including a first wiring board; and a second wiring board to which the analog duplexer is mounted, wherein the first wiring board is a wiring board, comprising:

a core wiring board provided with a coil-shaped inductor having a through electrode and a wiring pattern and arranged in a core substrate via an inorganic adhesive layer, and with a land pattern provided on the core substrate and connected to an outer layer;

insulating resin layers covering both surfaces of the core wiring board;

a capacitor provided on one of the insulating resin layers on one side of the core wiring board and having a structure with a dielectric layer sandwiched between an upper electrode pattern and a lower electrode pattern electrically connecting to the wiring pattern of the inductor; and a wiring pattern for connecting to an external substrate, the wiring pattern being electrically connected to the land pattern and provided on the insulating resin layer.

2. The semiconductor device of claim 1, wherein the lower electrode pattern of the capacitor has an arithmetic surface roughness Ra of 50 nm or more and 150 nm or less.

3. The semiconductor device of claim 1, wherein the circuit including the inductor and the capacitor is a high-frequency filter.

4. The semiconductor device of claim 1, wherein the core substrate is a glass substrate having a thickness of 50 μm or more and 1000 μm or less.

5. The semiconductor device of claim 1, wherein the through electrode is formed in a through hole having a maximum diameter of 15 μm or more and 150 μm or less.

6. The semiconductor device of claim 1, wherein the wiring pattern of the inductor has a thickness of 25 μm or less.

7. The semiconductor device of claim 1, wherein the inorganic adhesive layer is a single-layer film of a single material selected from, or a single-layer or multilayered film of a combination of two or more materials selected from tin oxide, indium oxide, zinc oxide, nickel, nickel-phosphorus, chromium, chromium oxide, aluminum nitride, copper nitride, aluminum oxide, tantalum, titanium, and copper.

8. The semiconductor device of claim 1, wherein the through electrode and the wiring pattern included in the inductor are made of any one single metal or a compound of two or more metals of copper, silver, gold, nickel, platinum, palladium, ruthenium, tin, tin-silver, tin-silver-copper, tin-copper, tin-bismuth, and tin-lead.

9. The semiconductor device of claim 1, wherein the insulating resin layer is formed of any one material of or a composite of at least two materials of epoxy resin, phenolic resin, polyimide resin, cycloolefin, PBO resin, and acrylic resin.

10. A method of manufacturing a wiring board, comprising:

forming a through hole in a core substrate;

forming an inorganic adhesive layer on a surface of the core substrate including an inside of the through hole, and forming, on the inorganic adhesive layer, a land pattern for connecting to an inductor and an outer layer, thereafter removing an area of the inorganic adhesive layer on which neither the inductor nor the land pattern is stacked;

after removing the area of the inorganic adhesive layer, covering with insulating resin both surfaces of the core substrate on which the inductor and the land pattern are formed, and forming, in the insulating resin, an opening for electrically connecting to the inductor and the land pattern;

forming, on the insulating resin, a capacitor having a lower electrode pattern electrically connecting to the inductor via the opening, a dielectric layer, and an upper electrode pattern stacked in this order, and forming an external connection wiring pattern electrically connected to the land pattern via the opening to connect to an external substrate; and stacking an insulating resin to cover the capacitor and the external connection wiring pattern, and forming, in the insulating resin, an opening for electrically connecting to the upper electrode pattern of the capacitor and the external connection wiring pattern.

* * * * *